United States Patent [19]
Shi

[11] Patent Number: 5,552,547
[45] Date of Patent: Sep. 3, 1996

[54] ORGANOMETALLIC COMPLEXES WITH BUILT-IN FLUORESCENT DYES FOR USE IN LIGHT EMITTING DEVICES

[76] Inventor: Song Q. Shi, 4521 E. Gold Poppy Way, Phoenix, Ariz. 85283

[21] Appl. No.: 387,691

[22] Filed: Feb. 13, 1995

[51] Int. Cl.$^6$ .................................. C07F 5/06; C07F 5/00
[52] U.S. Cl. .................................. 546/7; 548/101; 556/1; 556/176
[58] Field of Search .................................. 556/1, 176, 7; 548/101

[56] References Cited

U.S. PATENT DOCUMENTS 5,150,006  9/1992  Van Slyke et al. .................. 313/504

*Primary Examiner*—Porfirio Nazario-Gonzales
*Attorney, Agent, or Firm*—Eugene A. Parsons

[57] ABSTRACT

A new class of organometallic complexes with built-in fluorescent dye for use in electroluminescent (EL) devices and a method of preparation are disclosed. An organometallic complex with built-in fluorescent dye as guest dopant is introduced into an organic EL device by thoroughly pre-mixing it with a host organometallic emitter in a certain ratio and co-depositing it from a single source. The organometallic complex with built-in fluorescent dye determines the emission color of the EL device.

3 Claims, 1 Drawing Sheet

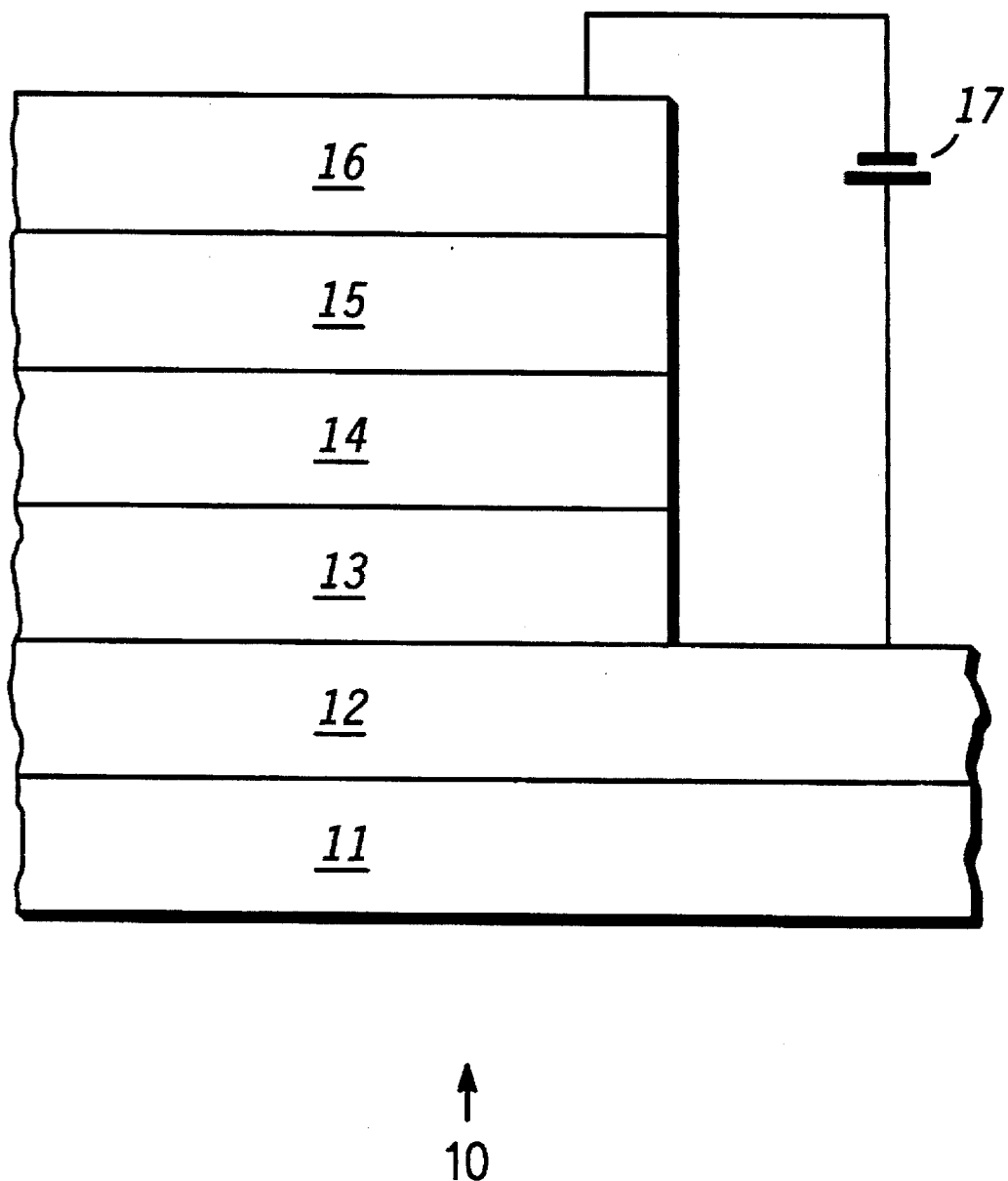

ORGANOMETALLIC COMPLEXES WITH BUILT-IN FLUORESCENT DYES FOR USE IN LIGHT EMITTING DEVICES

FIELD OF THE INVENTION

This invention relates to organic electroluminescent materials used in devices such as light emitting diodes.

BACKGROUND OF THE INVENTION

Organic electroluminescent (EL) devices are generally composed of three layers of organic molecules sandwiched between transparent and metallic electrodes, the three layers including an electron transporting layer, an emissive layer and a hole transporting layer. The EL efficiency is limited, in part, by the fluorescence efficiency of the emitter material. For example, the EL device based on a well-known organic emitter, 8-hydroxyquinoline aluminum (Alq), has a quantum efficiency of 1% (photon/electron) (C. W. Tang et al, J. Appl. Phys. 1989, 65, 3610). It has also been demonstrated that the performance of an organic EL device such as fluorescence efficiency and intensity was enhanced by about 3–4 times by doping Alq with a dye molecule of higher fluorescence efficiency. In the same prior art, light emission from 510 to 650 nm, that is, from green to orange-red, was achieved by doping Alq with green dye coumarin 540 and orange-red dye DCM1 respectively. However, the short wavelength light, namely, blue emission can not be attained with green fluorescent Alq as a host emitter. In a later patent (Vanslyke et al U.S. Pat. Nos. 4,539,507; 5,150,006), blue emission was achieved by doping a greenish-blue emissive Alq derivative, with a blue dye such as perylene.

These dye molecules used as guest dopants in organic EL devices in the prior art are classified as pure organic molecules and have the tendency to undergo recrystallization in the solid state. On the contrary, Alq and its derivative as host emitter belong to a different class of compounds, namely, organometallic molecules. Since the guest dopants and host emitter are two different class of materials, they have different intermolecular interaction, making them less compatible with each other. Under stressful operation conditions, the guest dopant and the host emitter have the possibility to undergo phase-separation, which may result in premature device failure in the long run.

Although Alq and its derivatives are thermally stable up to 400° C., most of the dye dopants have either melted or decomposed below 280° C. Thus, the thermal stability of a dye-doped organic EL device is most likely limited by the thermal stability of the individual dye molecule.

It has been established in the prior art that the optimal doping concentration of the guest dye in host emitter is about 0.5% in an organic EL device. At slightly higher doping levels, the phenomenon of concentration quench starts to occur, which actually lowers the fluorescent efficiency. Therefore having a firm control on the doping concentration is critical to the device performance. While Alq and its derivative, the host emitter, sublime at about 300° C. under $5 \times 10^{-6}$ torr vacuum, most of the dye dopants sublime below 200° C. As a result, the host emitter and the dye dopants generally have to be sublimed in two separate sources simultaneously. Since the host emitter normally has a thickness ranging from 200 to 400 Å, the dye dopants need to have a cumulative thickness of 1–2 Å in order to achieve an optimal 0.5% doping concentration level. The host emitter usually is sublimed at a rate of 5 Å/second. To achieve a homogeneously doped emitting layer, the dye dopants have to be sublimed at a rate of 0.025 Å/second. which, if not impossible to achieve, will be hardly reproducible in a manufacture environment.

It is a purpose of this invention to provide a class of new organometallic complexes with built-in dyes for use in light emitting devices.

It is another purpose of this invention to provide preparation methods for the disclosed organometallic complexes with built-in dyes for use in light emitting devices.

It is a still another purpose of this invention to provide a class of new organometallic complexes with built-in dyes as guest dopants for use in light emitting devices.

It is yet another purpose of the present invention to provide a class of new organometallic complexes with built-in dyes for use in light emitting devices with greater thermal stability.

It is a further purpose of this invention to provide a class of new organometallic complexes with built-in dyes as guest dopants that can be co-deposited with a host emitter for use in light emitting devices.

SUMMARY OF THE INVENTION

The above problems and others are at least partially solved and the above purposes and others are realized in a new class of organometallic complexes having the general formula:

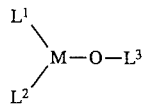

where:

M is a trivalent metal ion;

O represents oxygen atom;

L1 and L2 represent ligands that form a complex with metal ion M; L1 and L2 can be the same or different ligands; and L3 is a fluorescent dye molecule.

In addition, the preparation of the new class of organometallic complexes is described and the complexes are thermally more stable compared to conventional fluorescent dyes. When utilized in organic EL devices, the complexes as guest dopants can be co-deposited with the host emitter with precise control over doping concentration as well as distribution.

BRIEF DESCRIPTION OF THE DRAWING

The single FIGURE is a simplified sectional view of a light emitting diode in accordance with the present invention.

DESCRIPTION OF THE PREFERRED EMBODIMENTS

The present invention is directed to a class of new organometallic complexes with built-in fluorescent dye for use in organic light emitting devices which, in general, consist of thin layers of organic molecules sandwiched between transparent and metallic electrodes.

The single figure illustrates in a simplified cross-sectional view, one embodiment of an organic light emitting device (LED) 10. Organic LED 10 includes a substrate 11 which in this specific embodiment is a glass plate having a relatively planar upper surface. An electrically conductive layer 12 is deposited on the planar surface of substrate 11 so as to form a relatively uniform electrical contact. A first organic layer 13 of hole transporting material is deposited on the surface of conductive layer 12. A second organic layer 14 of a host emissive material containing a guest fluorescent dopant is deposited onto first organic layer 13. Then a third organic layer 15 of electron transporting material is deposited on the surface of layer 14 and a second electrically conductive layer 16 is deposited on the upper surface of third organic layer 15 to form a second electrical contact.

While it should be understood that light generated within second organic layer 14 can be emitted either through first organic layer 13, conductive layer 12 and substrate 11 or through third organic layer 15 and second conductive layer 16, in the present embodiment, substrate 11 is formed of glass and conductive layer 12 is formed of organic or inorganic conductors, such as conductive polyaniline (PANI), indium-tin-oxide (ITO), which are substantially transparent to visible light so that the emitted light exits downwardly through substrate 11 in the figure.

Further, in this embodiment, conductive layer 16 is formed of any of a wide range of metals or alloys in which at least one metal has a work function less than 4.0 eV. By the proper selection of material for conductive layer 16, the work functions of the materials making up layers 15 and 16 are substantially matched to reduce the required operating voltage and improve the efficiency of organic LED 10. Additional information on work function matching is disclosed in a copending U.S. Patent Application entitled "Organic LED with Improved Efficiency", filed 12 Sep. 1994, bearing Ser. No. 08/304,454, and assigned to the same assignee.

Also, in the figure organic LED 10 has a potential applied between layers 12 and 16 by means of a potential source 17. In this embodiment conductive layer 12 is a p-type contact and conductive layer 16 is an n-type contact. The negative terminal of potential source 17 is connected to conductive layer 16 and the positive terminal is connected to conductive layer 12. Electrons injected from the n-type contact (layer 16) are transported through organic layer 15 and into organic layer 14 (the emissive layer). Holes injected from the p-type contact (layer 12) are transported through organic layer 13 and into organic layer 14 (the emissive layer), where, upon an electron and a hole recombination, a photon is emitted.

Organic layer 13 is made of any known hole transporting organic molecules, such as aromatic tertiary amines (U.S. Pat. No. 5,150,006) and/or hole transporting polymers such as poly(phenylene vinylene), and is used to transport holes into organic layer 14 and confine electrons in organic layer 14. Organic layer 15 is made of any known electron transporting materials, such as tris (8-hydroxyquinolino)aluminum (U.S. Pat. No. 4, 539,507) and is used to transport electrons into organic layer 14 and confine holes within organic layer 14. Thus the holes and electrons have the maximum opportunity to recombine in organic layer 14 to give off light.

In general, it should be understood that organic layer 15 is optional, however, if organic LED 10 is modified by omitting organic layer 15, the device is still operational; but its operating efficiency is reduced. In some special applications it may be possible to eliminate organic layer 13 in addition to or instead of organic layer 15, however, it should again be understood that the efficiency and operating characteristics of organic LED 10 can be substantially modified.

In accordance with the present invention, the guest fluorescent dopant used in organic layer 14 (the emissive layer) in organic LED 10 is composed of at least one organometallic complex having a general formula:

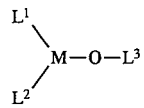

C-1 where:

M is a trivalent metal ion;

O represents oxygen atom;

L1 and L2 represent ligands that form a complex with metal ion M; and

L3 is a fluorescent dye molecule.

The ligands (L1 and L2) that form a complex with metal ion M are selected from one of the molecules having a general formula I or II or III as shown in the following:

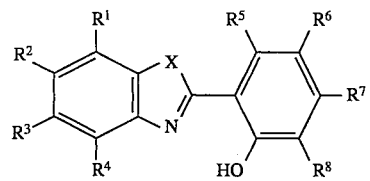

Formula I

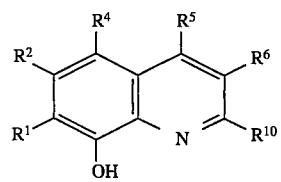

Formula II

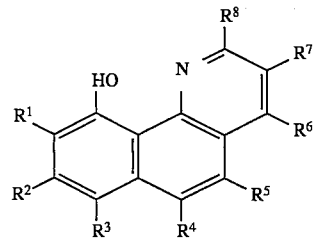

Formula III

Where:

X represents O, NH and CH₂ etc.;

R1 to R8 represent substitution possibilities at each position and each represent hydrogen or hydrocarbon groups or functional groups such as cyano, halogen, haloalkyl, haloalkoxy, alkoxyl, amido, amino, sulfonyl, carbonyl, carbonyloxy and oxycarbonyl etc.; and R10 represents a hydrocarbon group or a functional group, such as cyano, halogen, haloalkyl, haloalkoxy, alkoxyl, amido, amino, sulfonyl, carbonyl, carbonyloxy and oxycarbonyl, etc.

Though the ligands L1 and L2 can be the same or different, it is preferred in this embodiment that L1 and L2 are the same ligand because of the ease with which the disclosed organometallic complex (C-1) can be prepared.

Commercially available 2-(2-hydroxyphenyl)benzoxazole, 2-(2-hydroxyphenyl)benzothiazole, 2-(2-hydroxyphenyl)benzimidazole and 8-hydroxy-quinaldine are four representative examples for L1 and L2.

The embodied organometallic complex is generally prepared via the following reaction:

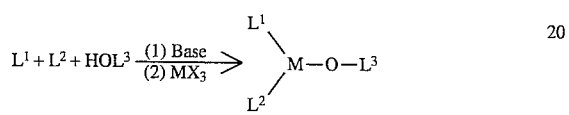

Where:

M is a trivalent metal ion; and

X is an anionic group including halides, sulfates, or nitrates.

In a typical reaction, one equivalent amount of ligand L1, L2 and a fluorescent dye with a hydroxy group (HO—L3) are suspended or dissolved in a solvent, and are treated with one equivalent amount of base such as sodium hydroxide, sodium ethoxide, sodium hydride and sodium amide under an inert atmosphere. After a homogeneous solution has been attained, one equivalent amount of trivalent metal salt (MX$_3$) is added into the solution. The precipitation that forms is collected by filtration and further purified by sublimation.

The metallic salts that can be used in the preparation of the embodied organometallic complex with built-in dye includes aluminum (III), Indium (III) and Gallium (III) compounds.

In cases where X is a basic group such as hydroxy (OH), alkoxyl (RO), hydride (H) or amide (NH$_2$), the base may be omitted in the preparation of the embodied complexes.

The fluorescent dye molecules that can be incorporated into C-1 must have a nucleophilic group that can chelate with center metal ion M. Though common nucleophilic groups such as hydroxy, thiol or amine all can chelate with a metal, the hydroxy group is preferred in this specific embodiment.

The fluorescent dye molecule (HO—L3) is selected so that the resulting organometallic complex with built-in fluorescent dye has a fluorescent emission in the region of 390 nm to 790 nm and is stable at least up to 280° C. under 5×10$^{-6}$ torr vacuum.

The following are a few specific examples of the hydroxy fluorescent dye molecules that satisfy the requirements for the HO—L3 in preparation of the embodied organometallic complexes with built-in fluorescent dyes:

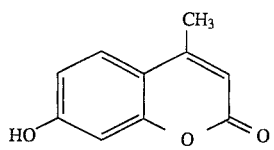

DL-1

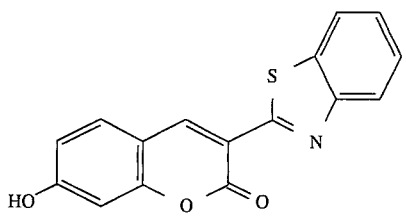

DL-2

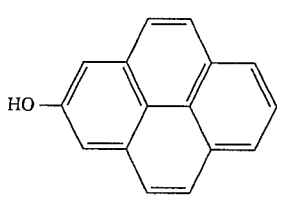

DL-3

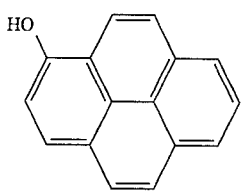

DL-4

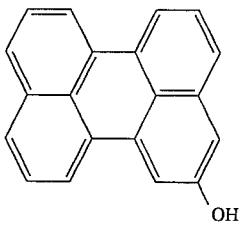

DL-5

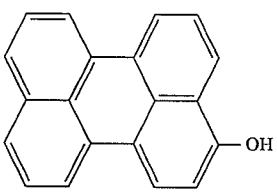

DL-6

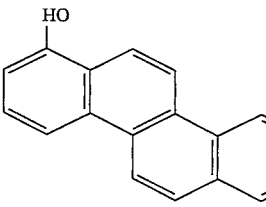

DL-7

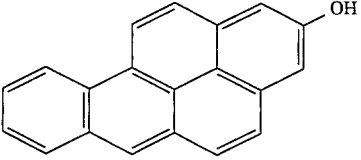

DL-8

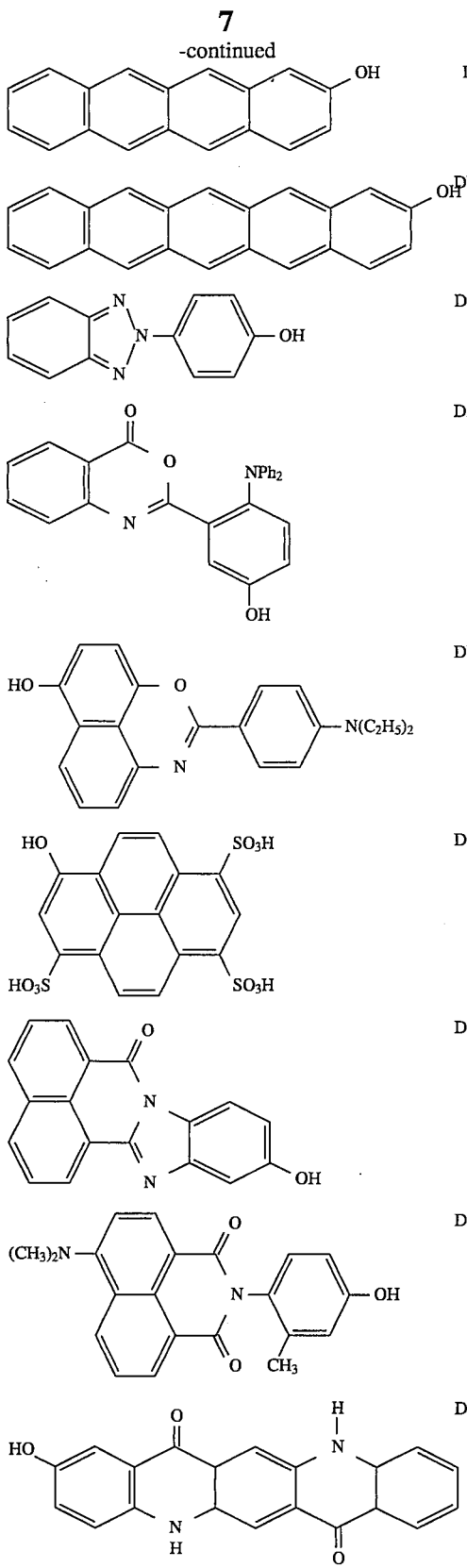

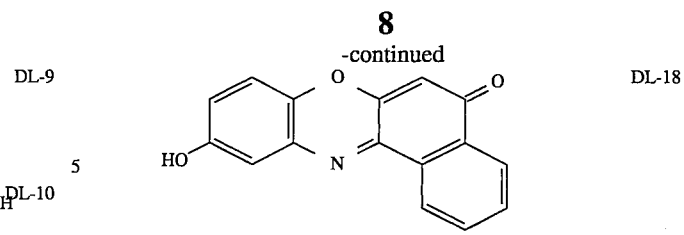

It has been demonstrated that in the absence of the fluorescent dye molecule, that is, L3 is non-fluorescent in C–1, the resulting organometallic complex emits in the blue to bluish-green region of the visible spectrum. With a fluorescent dye molecule incorporated, the emission color of the disclosed organometallic complex C–1 in dilute solution or in a host emitter is primarily determined by the fluorescent dye molecule since the fluorescent efficiency of the dye molecule is usually much higher. Therefore emission color of the embodied organometallic complex as guest dopant in a host emitter in an organic EL device may be manipulated in the region of 390 to 790 nm, with specific color depending on the specific hydroxy fluorescent dye molecule incorporated.

It should be emphasized that the embodied organometallic complexes are highly fluorescent in dilute solution or host emitter matrix with quantum efficiencies on the order of 40%–100%. In the solid state, however, their fluorescence may vary from moderate to low. For example, a pure bis(2-methyl- 8-quinolato)(4-methyl-7-oxo-coumarin)aluminum (C–1-A in the Examples section below)) film prepared by vapor deposition is moderate fluorescent, while bis(2-(2-oxophenyl)benzoxazole)( 1-oxo-pyrene)aluminum (C–1-C in the Examples section below) film is almost nonfluorescent.

To achieve an optimal EL efficiency in an organic EL device, an efficient excited-state energy transfer from the host emitter to the guest dye dopant is imperative. Only when the emission spectrum of the host emitter overlaps with the absorption spectrum of the guest dopant, or lies at the higher energy side of the absorption spectrum of the guest dopant, is there an energetically favored path that exists for an efficient energy transfer from the host emitter to the guest dye dopant. With a blue host emitter, a blue, or green, or red fluorescent dye may be used as guest dopant; with a green host emitter, only a green, or red fluorescent dye may be used as guest dopant; with a red host emitter, only a red fluorescent dye may be used as guest dopant.

For the embodied organometallic complexes with built-in dyes as guest dopants, the preferred host emitters are the blue emitting organometallic complexes disclosed in a pending U.S. Patent Application entitled "NEW ORGANOMETALLIC COMPLEXES FOR USE IN LIGHT EMITTING DEVICES", filed 12 Sep. 1994, bearing Ser. No. 08/304, 451, and assigned to the same assignee. The host emitter has one of the following general formulas

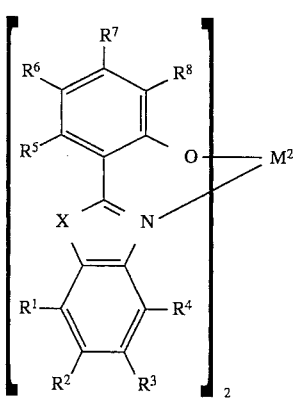

and

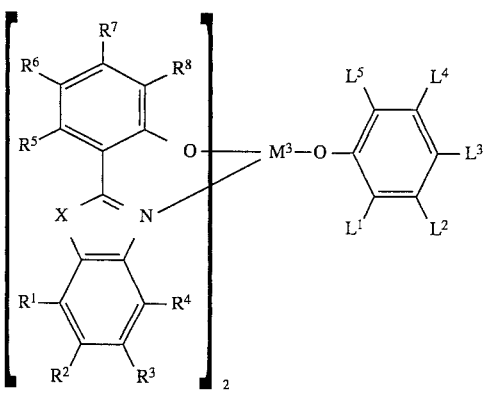

where:

$M^2$ is a divalent metal;

$M^3$ is a trivalent metal;

X represents one of O, S, NH and $CH_2$;

R1 to R8 represent substitution possibilities at each position and each represent hydrogen or hydrocarbon groups or functional groups; and L1 to L5 represent substitution possibilities at each position and each represent hydrogen or hydrocarbon groups or functional groups.

Another class of blue emitting materials disclosed by Vanslyke et al in U.S. Pat. No. 5,150,006 can also be used as host emitters. This class of host emitter has a general formula of:

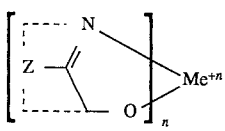

Where

Me represents a metal n is an integer of 1 to 3, and

Z represents the atoms necessary to complete an oxine nucleus

In general, organometallic complexes with built-in dyes as disclosed in this embodiment have excellent thermal stability and are purified by sublimation at around 300° C. at $5\times10^{-6}$ torr vacuum. They belong to the same class of materials as the host emitters suggested above and have a similar intermolecular interaction as the host emitters, making them structurally as well, as energetically compatible with the host emitters. When doped in the host emitters in an organic EL device, they are unlikely to undergo phase-separation, which may result in premature failure of the device.

The emission color of the organic LED 10, composed of one of the suggested organometallic complexes as a host emitter and one of the embodied organometallic complexes with built-in fluorescent dye as a guest dopant in the emissive layer, is determined by the guest dopant used.

The emissive layer in organic LED 10 with the host emitter doped with one of the disclosed organometallic complexes with built-in dyes is commonly deposited by thermal vapor deposition, electron beam evaporation, chemical deposition and the like. For a maximum device efficiency, the preferred guest dopant concentration in the host emitter is in the range of 0.05 to 5 mole percent. The exact guest dopant concentration in the host emitter is controlled by physically mixing the guest dopant with the host emitter in the desired ratio thoroughly to a homogenous state.

A uniform doping distribution is achieved by carrying out a co-deposition of the pre-mixed guest dopant and host emitter from a single source, since the guest dopant and the host emitter have similar sublimation temperatures. The co-deposition temperature is usually in the range of 280° to 350° C. under $5\times10^{-6}$ torr vacuum. This co-deposition significantly simplifies the organic EL device manufacture process, renders a precise control over the doping concentration and distribution and, thus, enhances the production yields.

EXAMPLES

This invention will be further described by the following examples, which are intended to illustrate specific embodiments of the invention but not to limit its scope.

EXAMPLE 1

Compiled in the following are the structures of three organometallic complexes with built-in fluorescent dyes that are used to illustrate the preparation methods for C–1.

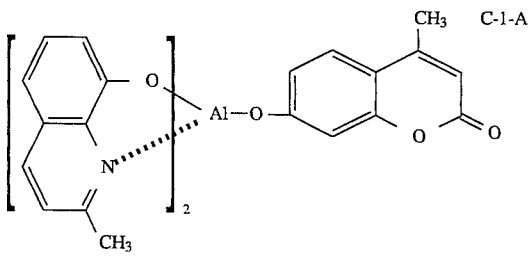

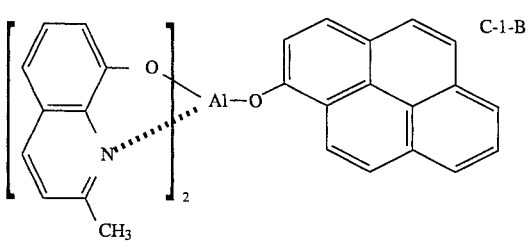

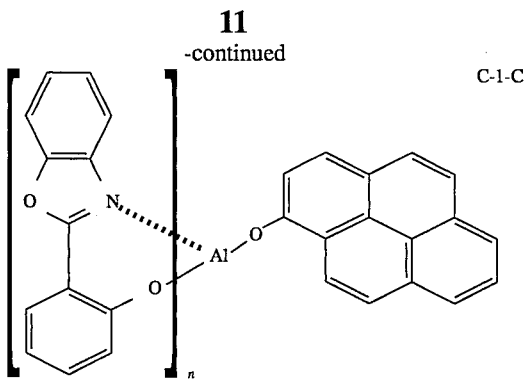

C-1-C

The procedures described below for synthesis of the organometallic complexes based on ligands L1=L2=8-hydroxy-quinaldine or L1=L2=2-(2-hydroxyphenylbenzoxazole) can be adapted to prepare all other embodied complexes with ligands (L1 and L2) having the general structure of Formula I and Formula II as disclosed in this invention. No attempt has been made to optimize the reaction conditions and the yields. The Selection of the reaction solvent is determined by the physical properties of ligands and hydroxy dye molecules to be used as well as the yields of the reaction. For a specific combination of ligands and a hydroxy dye molecule, different solvents may be used in the preparation with slightly different yields.

C-1-A

A mixture of 40 mmol of 8-hydroxyquinaldine (Aldrich Chemical Company) and 20 mmol of 7-hydroxy-4-methyl-coumarin (Aldrich Chemical Company) in 100 mL of methanol is treated with 60 mmol of sodium hydroxide pellet (Fisher Scientific Company) under argon atmosphere. The mixture is stirred and heated at reflux until all the sodium hydroxide pellets are dissolved. After the reaction mixture has cooled down to room temperature, it is added with 20 mmol of aluminum chloride hexahydrate (Aldrich Chemical Company). The resulting mixture is stirred at reflux for 16 hours and allowed to cool to room temperature. The solid complex is collected by filtration and washed with methanol, and dried under vacuum to afford the title compound in 21% yield.

C-1-B

A solution of one mmol of 1-hydroxypyrene (Aldrich Chemical Company) and 2 mmol of 8-hydroxyquinaldine (Aldrich Chemical Company) in 20 mL of methanol is treated with one mmol of aluminum isopropoxide (Aldrich Chemical Company). The reaction mixture is heated at reflux for 16 hours. The precipitation is collected by filtration and washed with methanol to yield 53% of the crude product after drying under vacuum.

C-1-C

A mixture of one mmol of 1-hydroxypyrene ((Aldrich Chemical Company), 2 mmol of 2-(2-hydroxyphenyl)-benzoxazole (Aldrich Chemical Company) and one mmol of aluminum isopropoxide (Aldrich Chemical Company) in 25 mL of ethyl ether is heated to reflux for 16 hours. The off-white precipitation is collected by filtration, washed with ethyl ether and dried under vacuum for two hours to afford 56% of crude product.

C-1-C

A mixture of 2 mmol of 1-hydroxypyrene ((Aldrich Chemical Company), 4 mmol of 2-(2-hydroxyphenyl)-benzoxazole (Aldrich Chemical Company) and 2 mmol of aluminum isopropoxide (Aldrich Chemical Company) in 30 mL of 2-propanol is heated to reflux for 18 hours. After the reaction mixture has cooled to room temperature, the pale yellowish solid that has formed is collected by filtration, washed with methanol and dried under vacuum for two hours to afford 98% of crude product.

EXAMPLE 2

The following procedure is used for the purification and characterization of the organometallic complexes disclosed in the invention.

A powder sample to be purified is placed into the sealed end of an one-end-sealed quartz tube which has been divided into several zones that are connected together with ground joints. The quartz tube is then inserted into an one-end-sealed Pyrex tube which has been Connected to a vacuum system. The sealed end of the quartz tube is in contact with the sealed end of the Pyrex tube. The Pyrex tube is then evacuated to $10^{-6}$ torr with a diffusion pump and the sealed end of the Pyrex tube is heated in a tube furnace. The pure product is sublimed into different zones than volatile impurities in the quartz tube and purification thus is achieved. The sublimation temperature ranges from 250° C. to 350° C. depending on the complexes.

The pure complexes were analyzed and characterized by ultraviolet-visible, infrared, photoluminescence spectra as well as elemental analyses. This provided confirmation for the structures and compositions of the desired complexes.

While I have shown and described specific embodiments of the present invention, further modifications and improvements will occur to those skilled in the art. I desire it to be understood, therefore, that this invention is not limited to the particular forms shown and I intend in the appended claims to cover all modifications that do not depart from the spirit and scope of this invention.

What is claimed is:

1. An organometallic complex with a built-in fluorescent dye having a general formula:

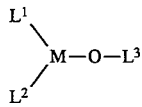

where:

M is a trivalent metal ion;

O represents oxygen atom;

L3 is a fluorescent molecule dye;

L1 and L2 are independently selected from one of the molecules having a general formula I or II or III as shown in the following:

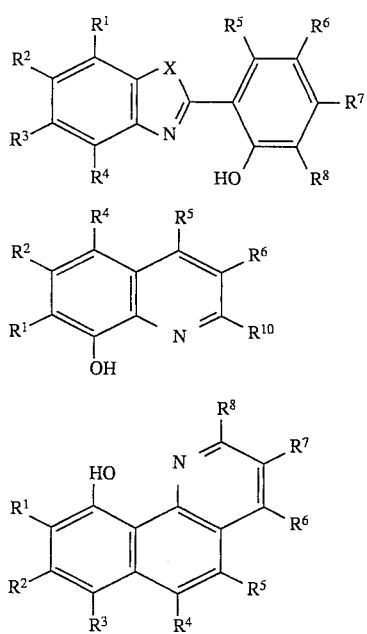

Formula I

Formula II

Formula III

Where:

X represents O, NH and CH₂; R1 to R8 represent substitution possibilities at each position and each represent hydrogen or hydrocarbon groups or functional groups selected from cyano, halogen, haloalkyl, haloalkoxy, alkoxyl, amido, amino, sulfonyl, carbonyl, carbonyloxy and oxycarbonyl; R10 represents a hydrocarbon group or a functional group such as cyano, halogen, haloalkyl, haloalkoxy, alkoxyl, amido, amino, sulfonyl, carbonyl, carbonyloxy and oxycarbonyl.

2. An organometallic complex with a built-in fluorescent dye as claimed in claim 1 wherein M is a trivalent metal selected from the following group: $Al^{+3}$, $Ga^{+3}$, and $In^{+3}$.

3. An organometallic complex with a built-in fluorescent dye as claimed in claim 1 including:

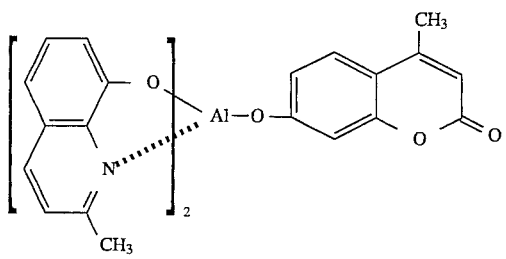

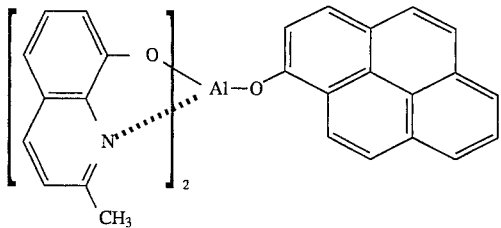

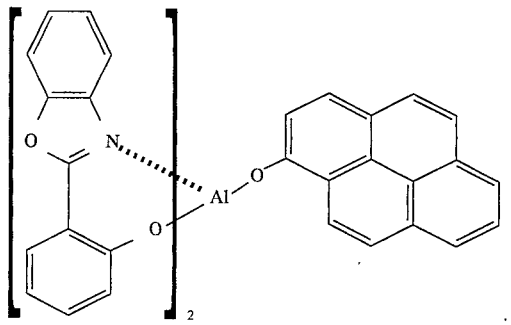

* * * * *